(12) United States Patent
Lee (10) Patent No.: US 11,437,999 B1
(45) Date of Patent: Sep. 6, 2022

(54) ANALOG PHASE LOCK LOOP

(71) Applicant: Tzi-Wei Lee, Baltimore, MD (US)

(72) Inventor: Tzi-Wei Lee, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 17/180,288

(22) Filed: Feb. 19, 2021

(51) Int. Cl.
  *H03D 3/24* (2006.01)
  *H03L 7/093* (2006.01)
  *H03L 7/099* (2006.01)

(52) U.S. Cl.
  CPC ............ *H03L 7/093* (2013.01); *H03L 7/0992* (2013.01)

(58) Field of Classification Search
  CPC ....... H03L 7/093; H03L 7/0992; H03L 7/083; H03C 3/0925
  USPC .................................. 375/376, 373, 374, 375
  See application file for complete search history.

(56) References Cited

U.S. PATENT DOCUMENTS

| | | | |
|---|---|---|---|
| 4,803,705 A | 2/1989 | Gillingham | |
| 5,477,177 A | 12/1995 | Wong | |
| 5,949,289 A | 9/1999 | Smith | |
| 5,959,502 A | 9/1999 | Ovens | |
| 6,313,708 B1 | 11/2001 | Beaulieu | |
| 6,809,598 B1 * | 10/2004 | Staszewski | H03C 3/0925 327/156 |
| 7,002,415 B2 | 2/2006 | Tsyrganovich | |
| 7,642,822 B2 | 1/2010 | Baker | |
| 10,171,073 B2 | 1/2019 | Horsky | |
| 10,284,087 B2 | 5/2019 | Tateishi | |
| 10,523,217 B2 | 12/2019 | Rieh | |
| 2012/0242313 A1 | 9/2012 | Ko | |
| 2016/0218722 A1 * | 7/2016 | Lachartre | H03L 7/083 |

* cited by examiner

*Primary Examiner* — Phuong Phu
(74) *Attorney, Agent, or Firm* — Edell, Shapiro & Finnan, LLC (57) ABSTRACT

A phase locked loop (PLL) comprises: a reference oscillator to generate a reference clock having a reference frequency; a voltage controlled oscillator (VCO) to generate a VCO clock having a VCO frequency controlled in response to a control signal applied to the VCO; a first integrator to integrate the reference frequency into a first ramp slope; a second integrator to integrate the VCO frequency into a second ramp slope; and a slope comparator to generate a slope difference between the first ramp slope and the second ramp slope and that is conveyed by the control signal, such that the control signal is configured to drive the VCO frequency toward the reference frequency to minimize the slope difference and frequency lock the VCO frequency to the reference frequency.

18 Claims, 5 Drawing Sheets

ANALOG PHASE LOCK LOOP

TECHNICAL FIELD

The present disclosure relates to analog phase lock loop circuits, systems, and methods.

BACKGROUND

A conventional phase lock loop (PLL) (also referred to as a phase locked loop (PLL)), may be implemented digitally (i.e., with digital circuits), and may include one or more of a digital divider, a phase detector, a charge pump, and a PLL filter to lock a frequency generated by a voltage controlled oscillator (VCO) to a reference frequency. Some of the aforementioned components may include bipolar transistors, which disadvantageously consume a relatively large amount of power. Moreover, the digital circuits may limit frequencies at which the PLL operates, and may occupy a relatively large footprint/area on an integrated circuit (IC) on which the PLL is constructed because digital dividers are relatively large circuits.

SUMMARY OF THE INVENTION

In an embodiment, an apparatus comprises a PLL that includes: a reference oscillator to generate a reference clock having a reference frequency; a VCO to generate a VCO clock having a VCO frequency controlled in response to a control signal applied to the VCO; a first integrator to integrate the reference frequency into a first ramp slope; a second integrator to integrate the VCO frequency into a second ramp slope; and a slope comparator to generate a slope difference between the first ramp slope and the second ramp slope and that is conveyed by the control signal, such that the control signal is configured to drive the VCO frequency toward the reference frequency to minimize the slope difference and lock the VCO frequency to the reference frequency. The apparatus may further comprise a frequency regenerator that includes: a third integrator to integrate the VCO frequency into successive ramp slopes; and a comparator to compare the successive ramp slopes against a direct current (DC) threshold voltage, to produce a regenerated frequency that is less than the VCO frequency.

Example embodiments are described below with reference to the following drawing figures, in which like reference numerals in the various figures are utilized to designate like components. Also, unless otherwise specified, the term coupled to (and, similarly, connected to) as used herein is broadly construed to cover arrangements in which a first circuit component is (i) directly connected to a second circuit component, and (ii) the first circuit component is indirectly coupled to the second circuit component through one or more intermediate or third circuit components.

DESCRIPTION OF EXAMPLE EMBODIMENTS

Embodiments presented herein are directed to an all analog PLL system including a PLL circuit implemented using primarily operational amplifiers (OA) (also referred to as op-amps) to frequency and phase lock a VCO frequency generated by a VCO to a reference frequency generated by a reference oscillator. Optionally, the PLL system further includes a frequency regenerator/side circuit to regenerate a frequency based on the VCO frequency. In an embodiment, the PLL system does not use any of a phase detector, a charge pump, a post-phase detector/charge pump PLL filter, and digital circuits (e.g., digital dividers). Therefore, the PLL system occupies a relatively smaller area of an IC on which the PLL system is constructed compared to a PLL system that employs the digital circuitry, for example. The op-amps of the PLL system may be implemented using complementary metal oxide semiconductor (CMOS) field effect transistors (FETs) (CMOSFETs) in sub-micron technology, for example, thus reducing power consumption of the PLL system compared to a conventional PLL system in which bipolar transistors are employed. Moreover, the PLL system can operate at a higher frequency, and achieve frequency lock more quickly, than a conventional, digitally implemented, PLL system.

Figure 1:
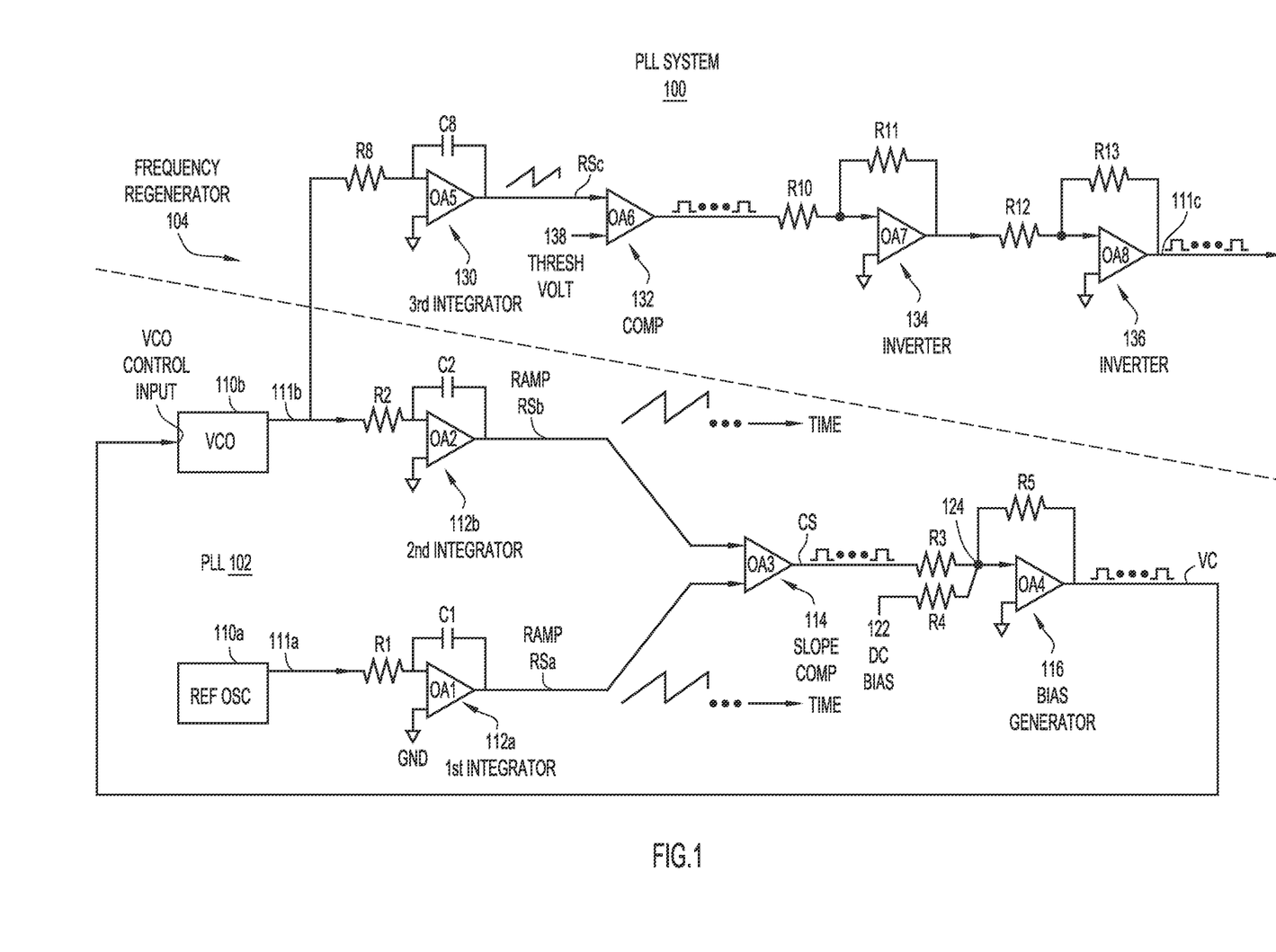
FIG. 1 is a circuit diagram of an example PLL system including a PLL circuit coupled to a frequency regenerator circuit, according to embodiments presented herein.

Referring to FIG. 1, there is a circuit diagram of an example PLL system 100. In the example of FIG. 1, PLL system 100 includes a PLL circuit (also referred to herein simply as a PLL) 102 coupled to a frequency (FREQ) regenerator circuit (also referred to herein simply as a frequency regenerator) 104, which represents an optional side circuit of PLL 102. In a standalone embodiment, PLL 102 is not coupled to frequency regenerator 104. PLL 102 is described first, and then frequency regenerator 104 is described.

In the example of FIG. 1, PLL 102 and frequency regenerator 104 are each implemented using all analog components/circuits without any digital components/circuits, i.e., PLL 102 is an all-analog PLL and frequency generator 104 is an all-analog frequency regenerator. The components/circuits of PLL system 100 may be constructed on an IC mounted on a printed circuit board (PCB) using known or hereafter developed fabrication techniques. The circuits/components of PLL 102 and frequency regenerator 104 may be implemented in sub-micron CMOS technology on the IC. For example, op-amp based circuits/components described below may be implemented using sub-micron CMOSFETs.

PLL 102 includes a reference (REF) oscillator (OCS) 110a to generate a reference clock signal or waveform (also referred to simply as a reference clock) 111a having a reference frequency, and a VCO 110b to generate a VCO clock signal or waveform (also referred to simply as a VCO clock) 111b having a VCO frequency and that is to be locked in frequency and phase to the reference clock (i.e., frequency locked and phase locked to the reference clock) by operation of the PLL. PLL 102 further includes a first or reference integrator 112a coupled to reference oscillator 110a, a second or VCO integrator 112b coupled to VCO 110b in parallel with the first integrator, a slope comparator (COMP) 114 coupled to the first and second integrators, in parallel, and an optional bias generator 116 coupled to the slope comparator and the VCO. Whether bias generator 116 is used depends on specific implementation details of VCO 110b.

VCO 110b generates VCO clock 111b with the VCO frequency (and phase) that is controlled in response to a VCO control signal VC derived by PLL 102 and that is applied to a control input of the VCO, as will be described below. VCO 110b may include any known or hereafter developed VCO oscillator, such as an inductor (L)-capacitor (C) (LC) oscillator, an LC-resistor (R) (LCR) oscillator, a multivibrator, a ring oscillator, a Colpitts oscillator, a crystal oscillator, and so on. VCO 110b may be constructed primarily based on CMOSFETs, for example. In an example, VCO clock 111b may approximate a sine wave or a square wave having a duty cycle of approximately 50%. The VCO frequency may be centered about any frequency in a range of 1 MHz to 10 GHz, for example, although frequencies above and below that range are possible.

Reference oscillator 110a may include a crystal oscillator that generates reference clock 111a with a relatively stable phase and frequency compared to VCO clock 111b when the VCO clock is not frequency locked to the reference clock. In an example, reference clock 111 a may approximate a sine wave or a square wave having a duty cycle of approximately 50%. The reference frequency may be centered anywhere in a range of 1 MHz to 10 GHz, for example, although frequencies above and below that range are possible. In the ensuing description, reference clock 111a and VCO clock 111b may also be referred to as the reference frequency and the VCO frequency, respectively.

Reference oscillator 110a provides reference clock 111a to first integrator 112a. First integrator 112a includes op-amp OA1, a resistor R1, and a capacitor C1 configured as an op-amp integrator as shown in FIG. 1, having a first integration time constant established by a resistor-capacitor (RC) time constant $\tau 1 = R1 \cdot C1$. Op-amp OA1 includes differential inverting and non-inverting inputs. In a first input configuration, the inverting input receives reference clock 111a, while the non-inverting input is connected to a ground potential (i.e., connected to ground). In a second input configuration, the non-inverting input receives reference clock 111a, while the inverting input is connected to ground. The first and second input configurations for op-amp OA1 produce respective integrated signals at an output of op-amp OA1 (as described below) with equal but oppositely signed magnitudes. Either input configuration may be used.

First integrator 112a integrates the reference frequency of reference clock 111a into a first or reference ramp signal RSa having a ramp slope indicative of the reference frequency. More specifically, first integrator 112a integrates successive cycles of reference clock 111a into successive ramp slopes. A gradient or steepness of the ramp slope is a function of integration/RC time constant $\tau 1$ and the reference frequency, and is indicative of the reference frequency. For example, the gradient of the ramp slope increases and decreases as the reference frequency increases and decreases, respectively. A temporal position of the ramp slope is indicative of a phase of reference clock 111a. In an example, integration/RC time constant $\tau 1$ is less than a cycle period (simply referred to as a period) of reference clock 111a (i.e., $\tau 1$ is a fraction of the period), such that integrator 112a integrates each cycle of the reference clock into a corresponding ramp slope. In an example, integration/RC time constant $\tau 1 < 50\%$ of the period, e.g., $\tau 1 \approx 30\%$ of the period.

VCO 110b provides VCO clock signal 111b to second integrator 112b. Second integrator 112b includes op-amp OA2, a resistor R2, and a capacitor C2 configured as an op-amp integrator as shown in FIG. 1, with a second integration/RC time constant $\tau 2 = R2 \cdot C2$. In the example of FIG. 1, resistors R1 and R2 have equal resistances, and capacitors C1 and C2 have equal capacitances. Thus, first integration/RC time constant $\tau 1$ (R1·C1)=second integration/RC time constant T2 (R2·C2). Thus, in the example above in which first integration/RC time constant $\tau 1$ is less than the period of reference clock 111a, it follows that second integration/RC time constant T2 is less than a period of VCO clock 111b. In a first input configuration, the inverting input of op-amp OA2 receives VCO clock 111b, while the non-inverting input is connected to ground. In a second input configuration, the non-inverting input of op-amp OA2 receives VCO clock 111b, while the inverting input is connected to ground. Either input configuration may be used.

Second integrator 112b operates similarly to first integrator 112a. Thus, second integrator 112b integrates the VCO frequency of VCO clock 111b into a second or VCO ramp signal RSb having a ramp slope indicative of the VCO frequency. Similar to first integrator 112a, second integrator 112b integrates successive cycles of VCO clock 111b into successive ramp slopes of second ramp signal RSb. A gradient or steepness of the ramp slope is a function of integration/RC time constant T2 and the VCO frequency, and indicates the VCO frequency. A temporal position of the ramp slope indicates a phase of VCO clock 111b.

Reference oscillator 110a and VCO 110b respectively provide reference clock 111a and VCO clock 111b to first integrator 112a and second integrator 112b in parallel (i.e., concurrently). In the example of FIG. 1, first integrator 112a and second integrator 112b are parallel (i.e., concurrent) integrators configured as separate circuit components that operate independently of each other. Thus, first integrator 112a and second integrator 112b respectively integrate the reference frequency and the VCO frequency in parallel, to produce first ramp signal RSa and second ramp signal RSb in parallel.

In the example of FIG. 1, first integrator 112a and second integrator 112b are coupled directly to slope comparator 114 in parallel. An alternative example (not shown) interposes (i.e., couples) a first op-amp inverter to (and between) first integrator 112a and slope comparator 114 to invert first ramp signal RSa, and interposes a second op-amp inverter to (and between) second integrator 112b and the slope comparator (and in parallel with the first op-amp inverter) to invert second ramp signal RSb. In this embodiment, in which integrators 112a and 112b are indirectly coupled to slope comparator 114 through the first and second op-amp inverters, respectively, the first and second op-amp inverters provide inverted version of first and second ramp signals RSa, RSb to slope comparator 114, in parallel.

Slope comparator 114 may be implemented as an op-amp slope comparator that includes op-amp OA3 having differential inputs to receive respective ones of first ramp signal RSa and second ramp signal RSb in parallel. Op-amp OA3 compares the ramp slope of first ramp signal RSa to the ramp slope of second ramp signal RSb, to produce a slope comparison signal CS indicative of the difference between the two ramp slopes (i.e., a ramp slope difference) at an output of the slope comparator. Because the ramp slope of first ramp signal RSa is indicative of the reference frequency and the reference phase, and the ramp slope of second ramp signal RSb is indicative of the VCO frequency and the VCO phase, the ramp slope difference represented in slope comparison signal CS is indicative of the difference in frequency (i.e., frequency difference) and the phase difference between the reference frequency and the VCO frequency. That is, the ramp slope difference is representative of the frequency difference.

More specifically, in operation, slope comparator 114 (i) receives successive first ramp slopes of first ramp signal RSa, (ii) receives successive second ramp slopes of second ramp signal RSb, and (iii) compares successive, concurrent pairs of the successive first ramp slopes and the successive second ramp slopes, to generate successive ramp slope differences between the successive, concurrent pairs. Slope comparator 114 generates the successive slope differences as pulses of slope comparison signal CS. Each pulse has a magnitude and/or duration that represents a magnitude of the ramp slope difference, and a sign that indicates which of the ramp slopes is greater (and thus, which of the reference frequency and the VCO frequency is greater). Timing of the pulses also embeds the phase difference between the reference and VCO clocks/frequencies.

Slope comparator 114 provides slope comparison signal CS (i.e., the ramp slope differences) to optional bias generator 116. Bias generator 116 includes an op-amp OA4 configured as an op-amp summer/adder to add a direct current (DC) bias voltage 122 to slope comparison signal CS, to produce VCO control signal VC (also referred to as VCO control voltage VC). Bias voltage 122 provides a startup or initial bias for VCO 110*b*. In the example of FIG. 1, bias generator 116 includes summing resistors R3 and R4 to receive slope comparison signal CS and DC bias voltage 122, respectively, and sum them into a summed voltage at a node 124 connected to a first differential input of op-amp OA4. A second differential input of op-amp OA4 is connected to ground. Bias generator 116 also includes a feed-forward resistor R5 coupled to node 124 and an output of the op amp OA5. Any known voltage source/circuit may be employed to generate DC bias voltage 122, such as a resistive divider, and the like. Bias generator 116 produces VCO control signal VC as a voltage-shifted version of slope comparison signal CS, e.g., of the pulses of the slope comparison signal. Thus, VCO control signal VC conveys the ramp slope differences of comparison signal CS, but in voltage-shifted form.

Generally, unlike embodiments presented herein, a PLL may use a phase detector followed by a low-pass filter (i.e., a loop filter) to generate a VCO control voltage. That is, the phase detector repeatedly detects a time/phase difference between edges of a reference clock and a VCO clock, and the loop filter smooths the output of the phase detector to produce the VCO control voltage. In contrast, in the example of FIG. 1, PLL 102 simply relies on a comparison between ramp slopes to derive the VCO control voltage, without the phase detector and without the loop filter. Moreover, generally, a PLL may include a digital divider to divide the VCO frequency to a lower frequency, which is supplied to the phase detector. In contrast, in the example of FIG. 1, PLL 102 does not include the digital divider, and thus occupies less space than when the digital divider is present. Omission of the digital divider in PLL 102 also enhances the speed at which the PLL can achieve frequency lock. In an alternative embodiment, a digital divider may be added to PLL 102 between the output of VCO 110*b* and the input to second integrator 112*b* to divide the VCO frequency to a lower frequency clock, which is then integrated into ramp slopes by the second integrator.

Bias generator 116 provides VCO control signal VC to the control input of VCO 110*b*, which controls the frequency and phase of VCO clock 111*b*. That is, VCO 110*b* is configured to vary or adjust the frequency and phase of VCO clock 111*b* based on/responsive to the pulses of VCO control signal VC. In an example, the VCO frequency increases (or decreases) with increases (or decreases) in the magnitude and/or duration of the pulses. In this manner, PLL 102 derives VCO control signal VC to drive the frequency and phase of VCO clock 111*b* toward that of reference clock 111*a*, to reduce the ramp slope differences (and thus reference and VCO frequency difference) conveyed in slope comparison signal CS (and VCO control voltage VC), which frequency and phase locks the VCO clock to the reference clock when the PLL operates in its steady state condition. For example, when the VCO frequency is less than (or greater than) the reference frequency, PLL 102 derives VCO control signal VC to increase (or decrease) the VCO frequency toward the reference frequency.

Frequency regenerator 104 is now described. Frequency regenerator 104 regenerates VCO clock 111*b*, to produce a regenerated clock signal or waveform (also referred to as simply regenerated clock) 111*c* with a regenerated frequency that differs from the VCO frequency. In an example, the regenerated frequency is multiple time less than the VCO frequency. In another example, the regenerated frequency is greater than the VCO frequency. Frequency regenerator 104 includes a third integrator 130, a comparator 132 coupled to the third integrator, a first inverter 134 coupled to the comparator, and a second inverter 136 coupled to the first inverter.

VCO 110*b* provides VCO clock 111*b* to third integrator 130. Third integrator 130 includes op-amp OA5, a resistor R8, and a capacitor C8 configured as an op-amp integrator with a third integration/RC time constant $\tau 3 = R8 \cdot C8$, which determines the regenerator frequency. For example, the regenerator frequency increases and decreases as time constant $\tau 3$ decreases and increases, respectively. Third integrator 130 integrates successive cycles of VCO clock 111*b* into successive ramp slopes of a third ramp signal RSc. In an example in which third integration/RC time constant $\tau 3$ is multiple times greater than the period of VCO clock 111*b* (e.g., $\tau 3 = 2.5 \cdot$the period), integrator 130 correspondingly integrates multiple cycles of VCO clock 111*b* into each ramp slope of third ramp signal RSc. Thus, the magnitude of third ramp signal RSc varies more slowly with time than does the magnitude of first ramp signal RSa and second ramp signal RSb. Conversely, when third integration/RC time constant $\tau 3$ is less than the period of VCO clock 111*b*, integrator 130 correspondingly integrates fractions of a cycle of VCO clock 111*b* into multiple ramp slopes of third ramp signal RSc, and the magnitude of third ramp signal RSc varies more quickly with time than does the magnitude of first ramp signal RSa and second ramp signal RSb.

Third integrator 130 provides more slowly/quickly varying third ramp signal RSc to comparator 132. Comparator 132 includes op-amp OA6 having a first differential input to receive third ramp signal RSc, and a second differential input to receive a DC threshold voltage 138. Threshold voltage 138 may be set equal to a mid-range voltage of the ramp slopes of third ramp signal RSc, for example. Any known voltage source may be used to generate threshold voltage 138, such as a resistive divider, for example. Op-amp OA6 compares successive ramp slopes of third ramp signal RSc to threshold voltage 138, to produce cycles of an intermediate regenerated clock signal or waveform (also referred to simply as intermediate regenerated clock) 140 at an output of the OA. For example, op-amp OA6 generates successive cycles of intermediate regenerated clock 140 corresponding to when the successive ramp slopes cross threshold voltage 138. In the example in which third integration/RC time constant $\tau 3 = 2.5 \cdot$the period of VCO clock 111*b*, the frequency of intermediate regenerated clock 140 is approximately 2.5 time less than the VCO frequency. Conversely, when third integration/RC time constant τ3 is less than the period of the VCO clock, the frequency of intermediate regenerated clock 140 is correspondingly higher than the VCO frequency. Thus, the intermediate regenerated clock frequency is proportional to a ratio of the VCO cycle period to third integration/RC time constant τ3.

Comparator 132 provides intermediate regenerated clock 140 to series-connected first and second inverters 134, 136. Inverters 134 and 136 are each configured as unity gain op-amp inverters. More specifically, inverter 134 includes op-amp OA7 and equivalent resistors R10 and R11 connected to each other to operate as an op-amp inverter, and inverter 136 includes op-amp OA8 and equivalent resistors R12 and R13 connected to each other to operate as an op-amp inverter. First and second inverters 134, 136 convert intermediate regenerated clock 140 to regenerated clock 111c. In doing so, first and second inverters 134, 136 sharpen, e.g., "square-up," rising and falling edges of the cycles of intermediate regenerated clock 140, to produce regenerated clock 111c as an approximate square wave.

Figure 2:
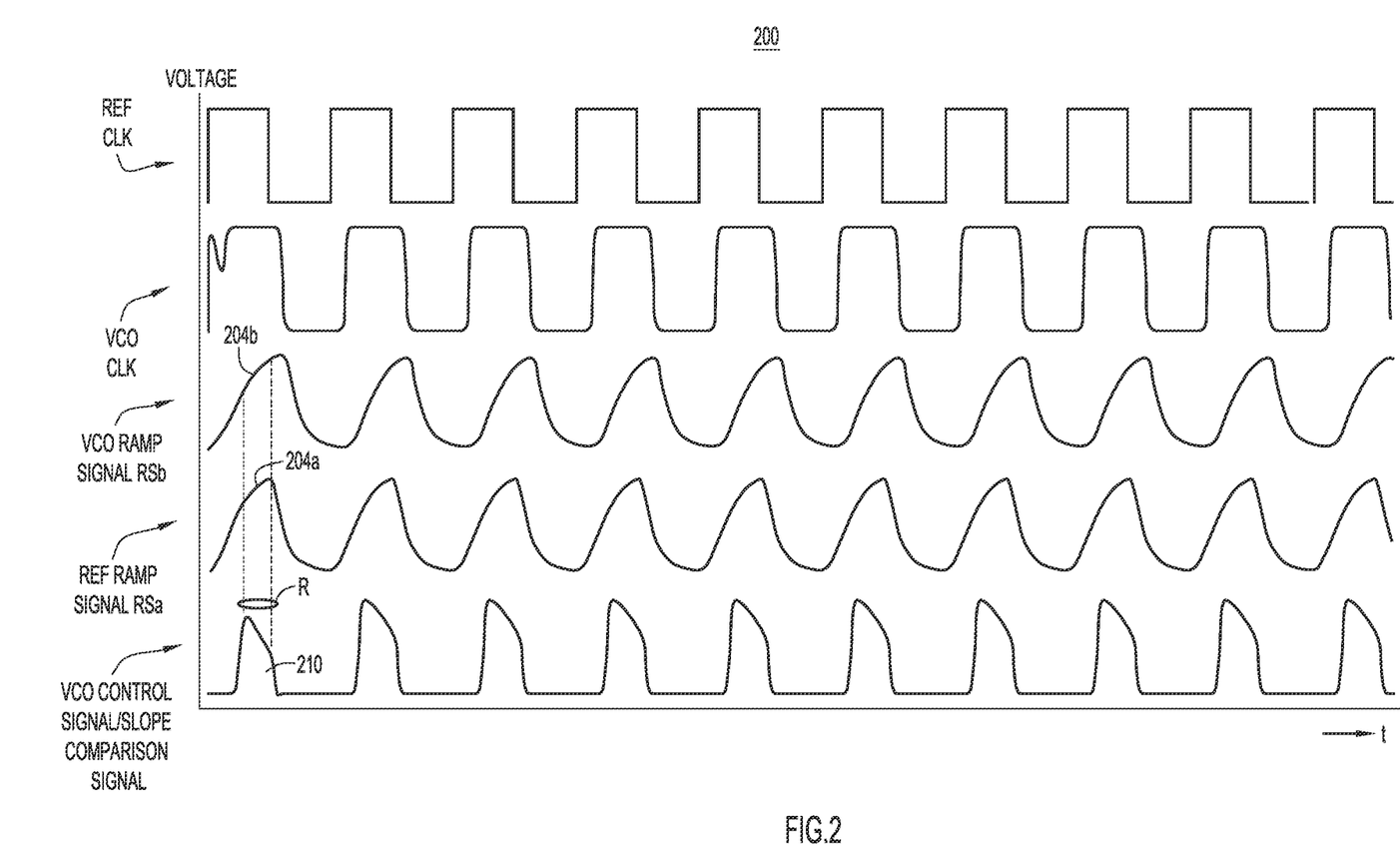
FIG. 2 shows example waveforms for various signals of the PLL circuit.

With reference to FIG. 2, there are shown example voltage vs. time waveforms 200 for various signals of PLL 102. Moving top-to-bottom in FIG. 2, the waveforms include waveforms for reference clock 111a, VCO clock 111b, VCO ramp signal RSb, first/reference ramp signal RSa, and second/VCO control signal VC, which is a voltage-shifted version of slope comparison signal CS. In an example, a voltage of each of reference clock 111a, VCO clock 111b, VCO ramp signal RSb, and first/reference ramp signal RSa may swing over a range of approximately 3-5 Volts. On the other hand, a voltage of each of the pulses of slope comparison signal CS may swing over a range of approximately 0.4 Volts. Also, in the example of FIG. 2, the cycle period of the reference clock (and the VCO clock) may be approximately 1 microsecond, although other cycle periods are possible.

In a time period R, slope comparator 114 compares concurrent rising-ramp slopes 204a and 204b of reference ramp signal RSa and VCO ramp signal RSb, respectively, to produce a pulse 210 of comparison signal CS indicative of a ramp slope difference (and frequency difference between the reference and VCO clock), as described above in connection with FIG. 1.

Figure 3:
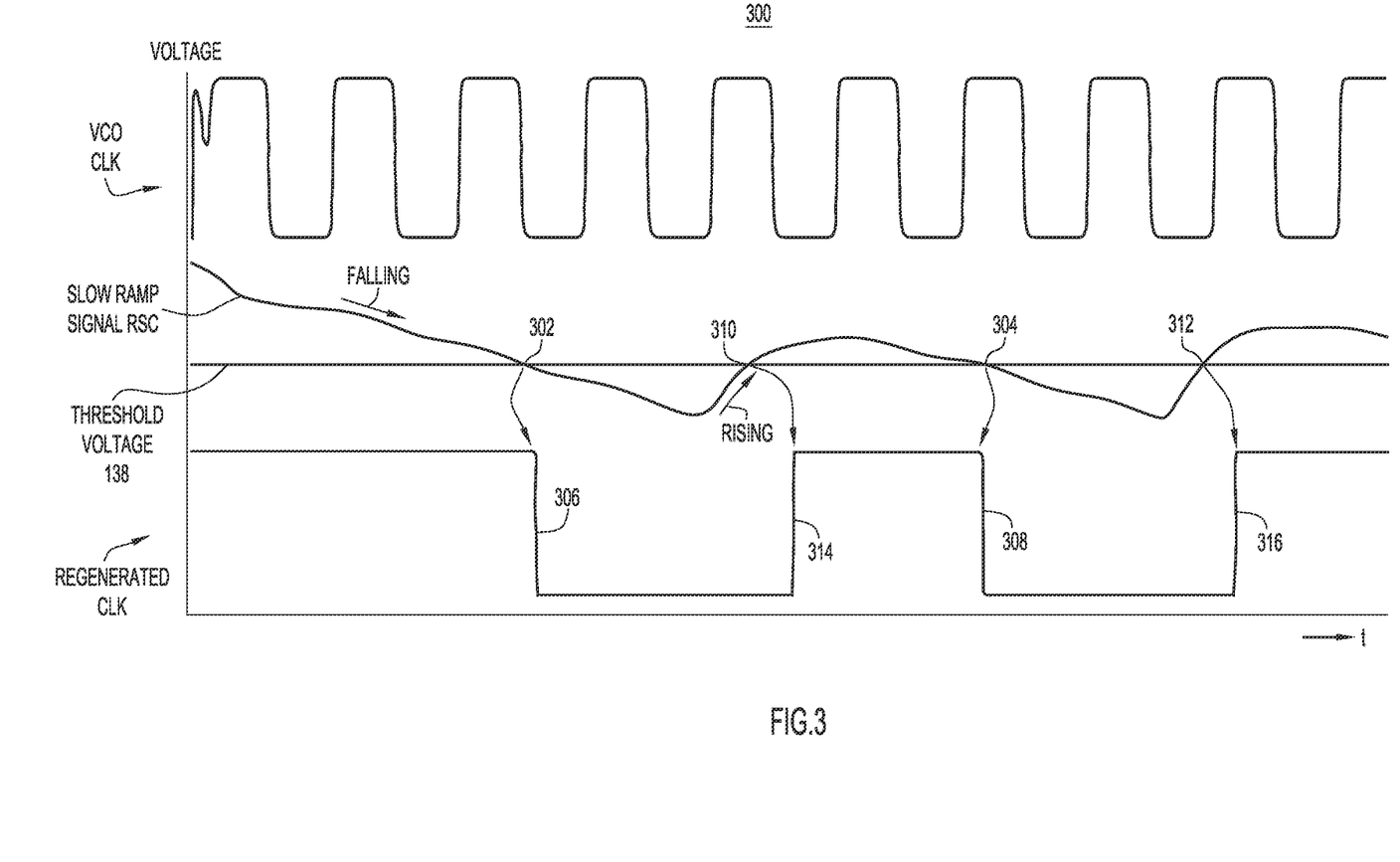
FIG. 3 shows example waveforms for various signals of the PLL circuit and the frequency regenerator circuit.

With reference to FIG. 3, there are shown example voltage vs. time waveforms 300 for various signals of PLL 102 and frequency regenerator 104. Moving top-to-bottom in FIG. 3, the waveforms include waveforms for VCO clock 111b, slow ramp signal RSc, threshold voltage 138, and regenerated clock 111c. In the example of FIG. 3, third integration/RC time constant τ3 is approximately 2.5 times first integration/RC time constant τ1 (and second integration/RC time constant τ2), which results in slow ramp signal RSc having a frequency that is approximately 2.5 times that of the VCO frequency. This causes the regenerated frequency to be approximately 2.5 times less than the VCO frequency due to successive crossings of threshold voltage 138 by slow ramp signal RSc. More specifically, as indicated by the arrows depicted in FIG. 3, when falling ramp slopes of ramp signal RSc cross threshold voltage 138 at instances 302, 304, comparator 132 generates corresponding falling edges 306, 308 of intermediate regenerated clock 140. Conversely, when rising ramp slopes of ramp signal RSc cross threshold voltage 138 at instances 310, 312, comparator 132 generates corresponding falling edges 314, 316 of intermediate regenerated clock 140.

Figure 4:
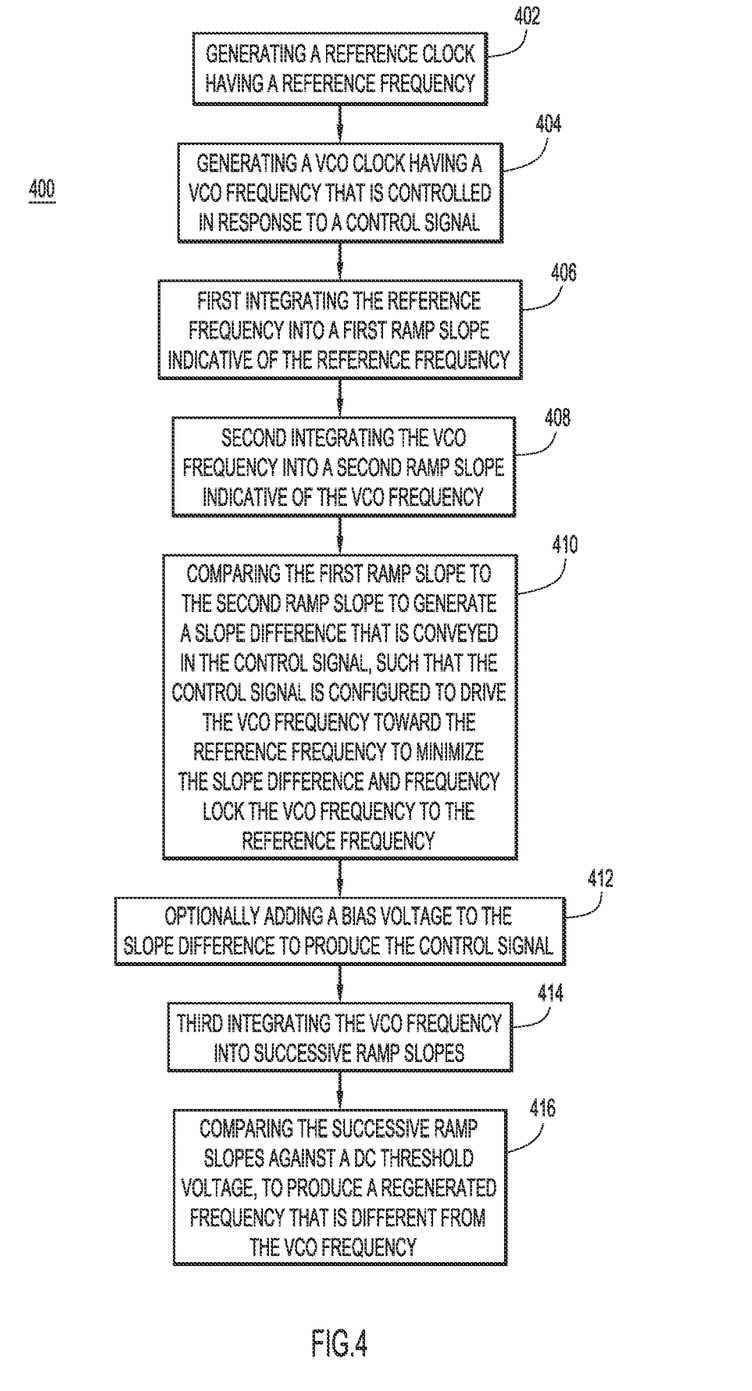
FIG. 4 is a flowchart of an example method of frequency/phase locking a VCO clock to a reference clock and regenerating the VCO clock performed by a PLL circuit.

With reference to FIG. 4, there is a flowchart of an example method 400 of frequency/phase locking a VCO clock to a reference clock by a PLL (e.g., PLL 102). Method 400 is based on operations described above in connection with FIGS. 1-3.

At 402, a reference oscillator generates a reference clock having a reference frequency, e.g., in a range of 1 MHz to 10 GHz.

At 404, a VCO generates a VCO clock having a VCO frequency (e.g., in a range of 1 MHz to 10 GHz) controlled in response to/based on a control signal applied to the VCO.

At 406, a first/reference integrator first integrates the reference frequency into a first ramp slope indicative of the reference frequency based on a first integration time constant.

At 408, a second/VCO integrator second integrates the VCO frequency into a second ramp slope indicative of the VCO frequency based on a second integration time constant. In an example, the first and second integration time constants are equal to each other, and may be a fraction (e.g., 50% or less) of a period of the reference clock and a fraction of a period of the VCO clock. The first and second integrators are parallel (i.e., concurrent) integrators and integrate the reference frequency and the VCO frequency in parallel (i.e., concurrently), to produce the first and second ramp signals in parallel.

At 410, a slope comparator compares the first ramp slope to the second ramp slope to generate a ramp slope difference (also referred to simply as a slope difference) between the first and second ramp slopes. The slope difference is representative of a frequency difference between the reference frequency and the VCO frequency. The slope difference is conveyed in the control signal, such that the control signal is configured to drive the VCO frequency toward the reference frequency to minimize the slope difference (and thus reference and VCO frequency difference) and frequency (and phase) lock the VCO frequency to the reference frequency in the steady state condition of the PLL. More specifically, the first integrator performs first integrating of successive cycles of the reference frequency into successive first ramp slopes, the second integrator performs second integrating of successive cycles of the VCO frequency into successive second ramp slopes, and the slope comparator performs generating successive slope differences between successive, concurrent pairs of the successive first ramp slopes and the successive second ramp slopes.

At 412, a bias generator adds a bias voltage to the slope difference to produce the control signal. Operation 412 is optional. With or without the bias generator, the control signal conveys or is representative of the slope differences produced by the slope comparator.

In an embodiment that includes a frequency regenerator (e.g., frequency regenerator 104) coupled to the PLL, method 400 further includes the following operations.

At 414, a third integrator third integrates the VCO frequency into successive third ramp slopes that vary in magnitude (i.e., rise and fall) relatively slowly compared to the first and second ramp slopes. The third integrator has an integration time constant that is greater than (or alternatively less than) the first integration time constant, and is greater than (or alternatively less than) the second integration time constant.

At 416, a comparator compares the successive third ramp slopes generated by the third integrator against a DC threshold voltage, to produce a regenerated frequency that is less than (or alternatively greater than) the VCO frequency.

Embodiments of the PLL and the frequency regenerator presented herein (e.g., PLL 102 and frequency regenerator 104) may be incorporated into a wide range of applications that benefit from one or more frequency signals or clocks having stable phases and frequencies, including frequency synthesizers, clock synchronizers, communication systems including signal modulators and signal demodulators, radar systems including radar transmitters and radar receivers, Kalman filter applications, and the like.

Figure 5:
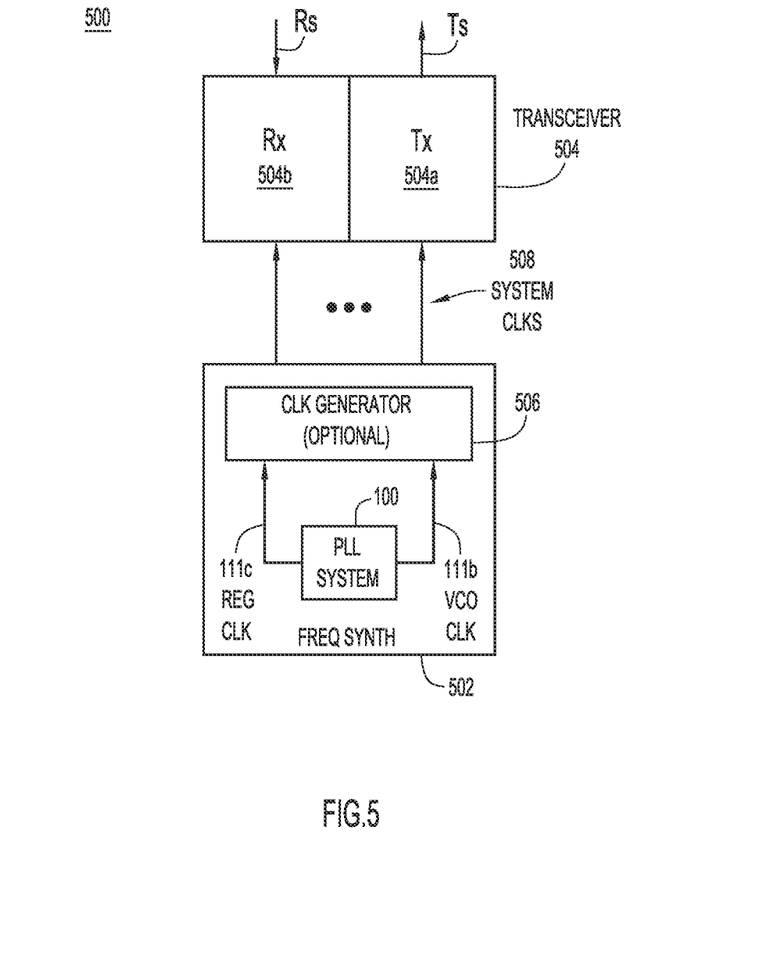
FIG. 5 is a block diagram of an example system that may employ PLL system 100.

With reference to FIG. 5, there is a block diagram of an example system 500 that may employ PLL system 100. System 500 may comprise a communication system or a radar system, for example. System 500 includes a frequency (FREQ) synthesizer (SYNTH) module 502 and a transmitter (TX)/receiver (RX) (transceiver) module 504 coupled to the frequency synthesizer module. Frequency synthesizer module 502 includes PLL system 100 to generate VCO clock 111b and regenerated (REG) clock 111c, and to provide these two clocks to an optional additional clock generator 506 of the frequency generator module, which generates system clock signals (simply referred to as system clocks) 508 at different frequencies from each other based on the two clocks. System clocks 508 have stable frequencies and phases based on the stable frequencies and phases of the two clocks from PLL system 100.

Frequency synthesizer module 502 provides system clocks 508 to a transmitter 504a and a receiver 504b of transceiver module 504. In alternative embodiments, system 500 may only include a transmitter or may only include a receiver. In both (i) the depicted embodiment of FIG. 5 in which frequency synthesizer module 502 includes additional clock generator 506, and (ii) an alternative embodiment in which the additional clock generator is omitted, PLL system 100 may provide VCO clock 111b and regenerated clock 111c directly to transceiver module 504 as/in system clocks 508. Transmitter 504a generates a transmit signal TS and receiver 504b processes a receive signal RS based on system clocks 508. For example, system clocks 508 may be used as local oscillator (LO) signals/clocks in (i) transmitter 504a to frequency up-convert a signal for subsequent transmission as transmit signal TS, and (ii) receiver 504b to frequency down-convert receive signal RS.

In an example, PLL system 100, clock generator 506, and transceiver module 504 may be implemented as ICs constructed on a PCB.

In summary, in one aspect, an apparatus is provided comprising: a phase locked loop (PLL) including: a reference oscillator to generate reference clock having a reference frequency; a voltage controlled oscillator (VCO) to generate a VCO clock having a VCO frequency controlled in response to a control signal applied to the VCO; a first integrator to integrate the reference frequency into a first ramp slope; a second integrator to integrate the VCO frequency into a second ramp slope; and a slope comparator to generate a slope difference between the first ramp slope and the second ramp slope and that is conveyed by the control signal, such that the control signal is configured to drive the VCO frequency toward the reference frequency to minimize the slope difference and frequency lock the VCO frequency to the reference frequency. The apparatus may further comprise a frequency regenerator including: a third integrator to integrate the VCO frequency into successive ramp slopes; and a comparator to compare the successive ramp slopes against a direct current (DC) threshold voltage, to produce a regenerated frequency that is less than the VCO frequency.

In another aspect, a method is provided comprising: generating a reference clock having a reference frequency; generating a voltage controlled oscillator (VCO) clock having a VCO frequency that is controlled in response to a control signal; first integrating the reference frequency into a first ramp slope indicative of the reference frequency; second integrating the VCO frequency into a second ramp slope indicative of the VCO frequency; and generating a slope difference between the first ramp slope and the second ramp slope and that is conveyed by the control signal, such that the control signal drives the VCO frequency toward the reference frequency to minimize the slope difference and frequency lock the VCO frequency to the reference frequency.

The above description is intended by way of example only. The description is not intended to be exhaustive nor is the invention intended to be limited to the disclosed example embodiment(s). Many modifications and variations will be apparent to those of ordinary skill in the art without departing from the scope and spirit of the invention.

What is claimed is:

1. An apparatus comprising:
 a phase locked loop (PLL) including:
  a reference oscillator to generate a reference clock having a reference frequency;
  a voltage controlled oscillator (VCO) to generate a VCO clock having a VCO frequency controlled in response to a control signal applied to the VCO;
  a first integrator, including a first operational amplifier (op-amp) coupled to a first resistor-capacitor (RC) circuit, to integrate the reference frequency into a first ramp slope;
  a second integrator, including a second op-amp coupled to a second RC circuit, to integrate the VCO frequency into a second ramp slope; and
  a slope comparator, including an op-amp comparator, to generate a slope difference between the first ramp slope and the second ramp slope and that is conveyed by the control signal, such that the control signal is configured to drive the VCO frequency toward the reference frequency to minimize the slope difference and lock the VCO frequency to the reference frequency.

2. The apparatus of claim 1, further comprising:
 a bias generator to add a bias voltage to the slope difference to produce the control signal.

3. The apparatus of claim 1, wherein the PLL does not include any of a phase detector, a charge pump, and a PLL filter.

4. The apparatus of claim 1, wherein the first integrator and the second integrator are configured to integrate the reference frequency and the VCO frequency in parallel, to produce the first ramp slope and the second ramp slope in parallel.

5. The apparatus of claim 1, wherein:
 the first integrator is configured to integrate successive cycles of the reference frequency into successive first ramp slopes;
 the second integrator is configured to integrate successive cycles of the VCO frequency into successive second ramp slopes; and
 the slope comparator is configured to generate successive slope differences between successive, concurrent pairs of the successive first ramp slopes and the successive second ramp slopes.

6. The apparatus of claim 1, wherein:
 the first integrator includes a first integration time constant and the second integrator includes a second integration time constant that is equal to the first integration time constant.

7. The apparatus of claim 6, wherein:
the first integration time constant and the second integration time constant are each less than a cycle period of the reference frequency.

8. The apparatus of claim 1, further comprising:
a frequency regenerator including:
- a third integrator to integrate the VCO frequency into successive ramp slopes; and
- a comparator to compare the successive ramp slopes against a direct current (DC) threshold voltage, to produce a regenerated frequency that is different from the VCO frequency.

9. The apparatus of claim 8, wherein the third integrator includes an integration time constant that is different from a cycle period of the VCO frequency.

10. The apparatus of claim 8, wherein the third integrator includes an op-amp coupled to an RC circuit to establish an integration time constant of the third integrator, and the comparator includes an op-amp comparator.

11. A method comprising:
- generating a reference clock having a reference frequency;
- generating a voltage controlled oscillator (VCO) clock having a VCO frequency that is controlled in response to a control signal;
- first integrating the reference frequency, with a first integration time constant that is less than a cycle period of the reference frequency, into a first ramp slope;
- second integrating the VCO frequency, with a second integration time constant that is equal to the first integration time constant, into a second ramp slope; and
- generating a slope difference between the first ramp slope and the second ramp slope and that is conveyed by the control signal, such that the control signal drives the VCO frequency toward the reference frequency to minimize the slope difference and frequency lock the VCO frequency to the reference frequency.

12. The method of claim 11, further comprising:
adding a bias voltage to the slope difference to produce the control signal.

13. The method of claim 11, further comprising performing the first integrating, the second integrating, and the generating the slope difference without using any of a phase detector, a charge pump, a divider, and a PLL filter.

14. The method of claim 11, further comprising performing the first integrating and the second integrating in parallel, to produce the first ramp slope and the second ramp slope in parallel.

15. The method of claim 11, wherein:
- the first integrating includes integrating successive cycles of the reference frequency into successive first ramp slopes;
- the second integrating includes integrating successive cycles of the VCO frequency into successive second ramp slopes; and
- the generating the slope difference includes generating successive slope differences between successive, concurrent pairs of the successive first ramp slopes and the successive second ramp slopes.

16. The method of claim 11, further comprising:
- third integrating the VCO frequency into successive ramp slopes; and
- comparing the successive ramp slopes against a direct current (DC) threshold voltage, to produce a regenerated frequency that is different from the VCO frequency.

17. The method of claim 16, wherein the third integrating includes integrating with a time constant that is different from a cycle period of the VCO frequency.

18. An apparatus comprising:
a phase locked loop (PLL) including:
- a reference oscillator to generate a reference clock having a reference frequency;
- a voltage controlled oscillator (VCO) to generate a VCO clock having a VCO frequency controlled in response to a control signal applied to the VCO;
- a first integrator to integrate the reference frequency into a first ramp slope;
- a second integrator to integrate the VCO frequency into a second ramp slope; and
- a slope comparator to generate a slope difference between the first ramp slope and the second ramp slope and that is conveyed by the control signal, such that the control signal is configured to drive the VCO frequency toward the reference frequency to minimize the slope difference and lock the VCO frequency to the reference frequency; and
a frequency regenerator including:
- a third integrator to integrate the VCO frequency into successive ramp slopes; and
- a comparator to compare the successive ramp slopes against a direct current (DC) threshold voltage, to produce a regenerated frequency that is different from the VCO frequency.

* * * * *